(12) United States Patent
Cheng et al.

(10) Patent No.: US 7,326,369 B2
(45) Date of Patent: Feb. 5, 2008

(54) LOW STRESS CONDUCTIVE ADHESIVE

(75) Inventors: Chih-Min Cheng, Westford, MA (US); Andrew Collins, Bedford, NH (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 107 days.

(21) Appl. No.: 11/073,778

(22) Filed: Mar. 7, 2005

(65) Prior Publication Data

US 2006/0197066 A1    Sep. 7, 2006

(51) Int. Cl.
*H01B 1/12* (2006.01)
*H01B 1/02* (2006.01)
*H01B 1/08* (2006.01)

(52) U.S. Cl. .............. 252/519.33; 252/512; 252/518.1

(58) Field of Classification Search ............. 252/500, 252/519.33, 512, 518.1
See application file for complete search history.

(56) References Cited

U.S. PATENT DOCUMENTS

| | | | |
|---|---|---|---|
| 4,695,508 A | 9/1987 | Kageyama et al. | |
| 4,999,136 A | 3/1991 | Su et al. | |
| 5,043,102 A * | 8/1991 | Chen et al. | 252/514 |
| 5,250,228 A | 10/1993 | Baigrie et al. | |
| 5,645,764 A * | 7/1997 | Angelopoulos et al. | 252/500 |
| 5,863,988 A | 1/1999 | Hashimoto et al. | |
| 6,126,865 A * | 10/2000 | Haak et al. | 252/512 |
| 6,246,123 B1 | 6/2001 | Landers, Jr. et al. | |
| 6,344,155 B1 | 2/2002 | Kitahara et al. | |

FOREIGN PATENT DOCUMENTS

| | | |
|---|---|---|
| EP | 0 325 022 A | 7/1989 |
| EP | 0 512 546 A | 11/1992 |
| EP | 0 892 027 A | 1/1999 |
| EP | 1 602 674 A | 12/2005 |
| WO | WO 99/67324 A | 12/1999 |
| WO | WO 2005/056675 A | 6/2005 |

OTHER PUBLICATIONS

Nagase ChemteX Corporation, "Acrylic ester polymer Teisan Resin"; Suspension polymerization type Teisan Resin.
Nagase ChemteX Corporation, "Acrylic ester polymer Teisan Resin"; Suspension polymerization type Teisan Resin, May 18, 2005.

* cited by examiner

*Primary Examiner*—Mark Kopec
*Assistant Examiner*—Jaison Thomas
(74) *Attorney, Agent, or Firm*—Sun Hee Lehmann

(57) ABSTRACT

A low stress conductive film or paste adhesive that comprises a) one or more functional acrylic copolymers or terpolymers; b) epoxy; and c) conductive filler. Additional ingredients, such as adhesion promoters and conductivity enhancers may also be utilized. The conductive film or paste adhesive provides higher adhesion strength than traditional flexible conductive film adhesives and a lower stress between the bonded components than existing high adhesion strength conductive films.

10 Claims, No Drawings

LOW STRESS CONDUCTIVE ADHESIVE

FIELD OF THE INVENTION

This invention relates to compositions that are suitable for use as conductive materials in microelectronic devices or semiconductor packages to provide electrically stable interconnections.

BACKGROUND OF THE INVENTION

Conductive compositions are used for a variety of purposes in the fabrication and assembly of semiconductor packages and microelectronic devices. For example, conductive adhesives are used to bond integrated circuit chips to substrates (die attach adhesives) or circuit assemblies to printed wire boards (surface mount conductive adhesives).

The leading technique used throughout the electronics industry for soldering components to the substrate uses a metallic solder alloy which is so called eutectic solder containing by weight 63% tin and 37% lead. It is applied to the circuit board as a paste or a solder preform which is heated to above its melting temperature (183° C.) to let solder paste melt and form joint. Alternatively, the board is passed over a molten wave of solder to form joints to bond the electrical components to the circuit board. In either case, a flux material is used to remove surface oxidation from metallic surfaces and allow the molten solder to strongly bond to the surfaces and form reliable solder joints with excellent impact resistance. While the solder technology has existed for many decades, it has several shortcomings. Lead in the alloy is not environmental friendly. Numerous environmental regulations have been proposed to tax, limit, or ban the use of lead in the electronic solders. Secondly, high process temperature requires using more expensive thermostable substrate and does not fit flexible substrate that becomes more popular in the electronic industry. Another shortcoming is extra step to clean up the residue from flux material after reflow process which is an expensive and inefficient process.

Conductive adhesives offer several advantages over traditional solder assembly due to the absence of lead, low processing temperatures and a simplified assembly process that does not require solder flux and subsequent flux cleaning steps. Among the desired properties of conductive adhesives are long work life at room temperature, relatively low curing temperature and relatively short curing time, good rheology for screen printing, sufficient conductivity to carry an electric current when cured, acceptable adhesion to the substrate when cured, stable electrical resistance at high temperature and humidity over long periods of time, and good impact strength. Conductive adhesives are particularly useful for large area assemblies intended for various microwave applications which require bonding of a FR4 or ceramic circuit board to a metal substrate having an aluminum or copper core. In such applications, conductive adhesives provide electrical integrity, bond-line consistency and improved thermal dissipation that insures compliance with regulatory requirements, minimizes losses, minimizes distortion of high frequency digital signals and maintains low impedance to the ground plane.

Two types of conductive adhesives, film and paste, are commonly utilized. Film adhesives are utilized as low temperature process alternatives to solder and create a consistent ground path between an electrical circuit board and a metal backer. Film conductive adhesives are preferred for large area assembly due to their consistency in bond line thickness, low flow properties and availability as an intricate die cut part. Film adhesives are received by the end assembler in a B-stage condition having been pre-cut to the dimensions of the desired PCB. The carrier substrate, usually MYLAR, is removed from the film, the film is placed between the substrates to be bonded, and the package is bonded together under elevated temperature and pressure. Further, because film adhesives have a much higher viscosity than paste adhesives, settling of the filler is not a concern when the film is stored at room temperature for an extended period of time.

One issue surrounding film adhesives is their flexibility. Film adhesive having high strength are generally high modulus adhesives with limited flexibility. Such films having a high modulus and high cross-link density create a high stress condition due to extreme differences in the coefficient of thermal expansion between the board and the metal heat sink after cure. The result of the high stress is a high degree of warpage in the final assembly. Film adhesives that offer low stress are typically lower in modulus and also lower in adhesion strength. Consequently, commercially available flexible films are lower in adhesion strength than non-flexible films.

Paste conductive adhesives may also be used to bond together large areas, especially if the adhesive is screen printed onto the substrate. The screen printing enables high volume manufactures and limits waste. Paste conductive adhesives may also be B-stageable so that they may be pre-applied on the component in a manner similar to a film, stored, and then heated for final bonding. The rheology of paste adhesives must be monitored to insure accurate deposits of adhesive on the circuit boards. Likewise, the rheology of the paste must be monitored to avoid bleed out or slumping during the B-stage or cure processes.

It would be an advantage, therefore, to provide conductive film and paste adhesives that provide low stress and high adhesion to form electrically stable assemblies for use in semiconductor packaging operations. Advantageously, the adhesive would have a combination of superior adhesion to common flexible film adhesives and superior stress reduction as compared to common high strength film adhesives.

SUMMARY OF THE INVENTION

This invention is a low stress isotropic conductive film or paste adhesive that comprises a) one or more functional acrylic copolymers; b) epoxy; and c) conductive filler. Additional ingredients, such as adhesion promoters, curing agents and conductivity enhancers may also be utilized. The conductive film adhesive of the invention provides higher adhesion strength than traditional flexible conductive film adhesives and a lower stress between the bonded components than existing high adhesion strength conductive films.

DETAILED DESCRIPTION OF THE INVENTION

The conductive adhesive of the present invention comprises a) one or more functional acrylic copolymers or terpolymers; b) epoxy; and c) conductive filler. In the preferred embodiment, one or more adhesion promoters, curing agents and conductivity additives are also included. Where functional acrylic copolymers are referred to, it is to be understood that the functional acrylic may also comprise a terpolymer.

The functional acrylic copolymer of the invention is soluble in coating solvent and thus enables a low stress, high strength film forming or paste adhesive. The preferred acrylic copolymer is a saturated polymer and thus more resistant to oxidation, aging and deterioration than typical rubber reinforcing resins such as carboxyl-terminated butadiene nitrile rubber. The composition of the copolymer is preferably butyl acrylate-ethyl acrylonitrile or butyl acrylate-co-ethyl acrylonitrile or ethyl acrylate-acrylonitrile to provide high molecular weight polymerization. The copolymer preferably has hydroxyl, carboxylic acid, isocyanate or epoxy functionality to improve the solvent and epoxy compatibility. The molecular weight of the copolymer is high and preferably in the range of about 200,000 to about 900,000. The glass transition temperatures (Tg) of the copolymer are low relative to room temperature and preferably within the range of about 30° C. to about −40° C. While various functional acrylic copolymers may be utilized, a preferred functional acrylic copolymer is TEISAN RESIN SG80H, commercially available from Nagase ChemteX Corporation of Osaka, Japan.

The preferred epoxy resin for use with the present invention include monofunctional and multifunctional glycidyl ethers of Bisphenol-A and Bisphenol-F, aliphatic and aromatic epoxies, saturated and unsaturated epoxies, or cycloaliphatic epoxy resins or a combination thereof. A most preferred epoxy resin is bisphenol A type resin. These resins are generally prepared by the reaction of one mole of bisphenol A resin and two moles of epichlorohydrin. A further preferred type of epoxy resin is epoxy novolac resin. Epoxy novolac resin is commonly prepared by the reaction of phenolic resin and epichlorohydrin. Dicyclopentadiene-phenol epoxy resin, naphthalene resins, epoxy functional butadiene acrylonitrile copolymers, epoxy functional polydimethyl siloxane, epoxy functional copolymers and mixtures thereof are additional types of epoxy resins which may be employed. Commercially available bisphenol-F type resin is available from CVC Specialty Chemicals, Maple Shade, N.J., under the designation 8230E and Resolution Performance Products Ltd. under the designation RSL1739. Bisphenol-A type epoxy resin is commercially available from Resolution Performance Products Ltd. as EPON 828, and a blend of bisphenol-A and bisphenol-F is available from Nippon Chemical Company under the designation ZX-1059.

The electrically conductive material may comprise conductive fillers. Exemplary conductive fillers are silver, copper, gold, palladium, platinum, carbon black, carbon fiber, graphite, aluminum, indium tin oxide, silver coated copper, silver coated aluminum, bismuth, tin, bismuth-tin alloy, metallic coated glass spheres, silver coated fiber, silver coated spheres, antimony doped tin oxide, carbon nanotubes, conductive nanofiller, conductive oxides and mixtures thereof.

Optionally, suitable flow additives, adhesion promoters, conductivity additives, curing agents, and rheology modifiers may be added as desired. Optional flow additives include silicon polymers, ethyl acrylate/2-ethylhexyl acrylate copolymers, alkylol ammonium salt of acid phosphoric acid esters of ketoxime or mixtures thereof. Suitable adhesion promoters include various forms of silane. Suitable rheology modifiers include thermoplastic resin and preferably polyvinyl acetal. Suitable conductivity additives include anhydride, glutaric acid, citric acid, phosphoric acid and other acid catalysts. Suitable curing agents include, but are not limited to, Lewis Acids, anhydrides, amines, imidazoles, dicyandiamide and mixtures thereof.

The isotropic conductive adhesive composition of this embodiment of the invention contains up to about 4 to 19 weight percent of a functional acrylic copolymer; about 60 to 95 weight percent of a conductive filler; about 1 to 10 weight percent of an epoxy; about 0 to 10 weight percent of a curing agent; about 0 to 5 weight percent of conductivity additive; and about 0 to 5 weight percent of adhesion promoters, flow additives, rheology modifiers or other additives for a total of 100 weight percent. Preferably, the functional acrylic copolymer is present in the range of about 12 to 18 weight percent, the conductive filler is present in the range of about 70 to 90 weight percent, the epoxy is present in the range of about 2 to 8 weight percent, the curing agent is present in the range of about 0.1 to 3 weight percent, the conductivity additive is present in the range of about 0.01 to 1 weight percent and the other additives are present in the range of about 0 to about 5 weight percent.

The invention can be further described by the following example. Example. A functional acrylic copolymer according to the present invention was formulated with the ingredients in Table 1.

TABLE 1

Functional Acrylic Copolymer Formulation A

| Ingredient | Amount (wt %) |
|---|---|
| Functional Acrylic Copolymer | 15.30 |
| Epoxy[1] | 3.82 |
| Dicyandiamide | 0.78 |
| Conductivity Promoter | 0.10 |
| Silver Filler | 80.00 |

[1]RSL-1462 DGEGA epoxy, commercially available from Resolution Performance Products.

The performance of formulation A of Table 1 was tested along with the performance of commercially available high adhesion strength epoxy and low stress epoxy. The high adhesion strength epoxy (Comparative Example A) tested was CF3350, commercially available from Emerson & Cuming, and the low stress epoxy (Comparative Example B) tested was 8450WL, commercially available from AI Technologies. The results of those tests are shown in Table 2.

TABLE 2

Adhesive Composition Performance

| Adhesive | Die Shear Adhesion (Ceramic to Ceramic) (0.3 mm × 0.3 mm) | Warpage (LTCC to Au Plated Cu) (mils) | Die Shear Adhesion After Exposure to 260° C. Peak Reflow Profile | Bond-Line Integrity (Delamination or Good Adhesion) After Exposure to 260° C. Reflow Processes |
|---|---|---|---|---|
| Comparative Example A | >50 | >4 | >50 | Pass |
| Formulation A | 19 | 1.5 | 25 | Pass |
| Comparative Example B | 17 | 0.5 | 14 | Fail |

As shown in Table 2, the test sample containing the functional acrylic copolymer produced superior strength and a superior bond line integrity as compared to Comparative Example B. The retention of the adhesion strength is apparent in Table 2 after the assembly is exposed to reflow process temperatures. This retention of strength is a necessity as these adhesives may be utilized to bond substrates that are un-populated. Population of the circuit boards with components is performed with solder processes, thus the retention of adhesion strength is critical to the bond-line integrity. Comparative Example B did not perform well during exposure to reflow temperatures. This is evident in the reduction of adhesion strength and the change in the bond line integrity after exposure. The test formulation also produced a significant reduction in curvature (stress) as compared to the Comparative Example A. This reduction in stress was achieved without the loss of adhesive integrity after exposure to reflow processes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed is:

1. A composition for use in microelectronic devices comprising:
    a) a functional acrylic copolymer or terpolymer, wherein the functional acrylic copolymer or terpolymer has a Tg in the range of about 30° to about −40° C.;
    b) an epoxy;
    c) a conductive filler; and
    d) a curing agent to cause thermal curing of said composition.

2. The composition of claim 1 in which
    (a) the functional acrylic copolymer or terpolymer is present in an amount of about 4 to about 19 weight percent;
    (b) the epoxy is present in an amount of about 1 to about 8 weight percent;
    (c) the conductive filler present is in an amount of about 60 to about 95 weight percent; and
    (d) the curing agent present is in an amount of about 0.1 to about 3 weight percent.

3. The composition of claim 1, further comprising a conductivity additive.

4. The composition of claim 3 in which the conductivity additive is present in an amount of about 0.01 to about 1 weight percent.

5. The composition of claim 1, wherein the functional acrylic copolymer or terpolymer has hydroxyl, carboxylic acid, isocyanate or epoxy functionality.

6. The composition of claim 1, wherein the conductive filler is selected from the group consisting of silver, copper, gold, palladium, platinum, carbon black, carbon fiber, graphite, aluminum, indium tin oxide, silver coated copper, silver coated aluminum, bismuth, tin, bismuth-tin alloy, metallic coated glass spheres, silver coated fiber, silver coated spheres, antimony doped tin oxide, carbon nanotubes, conductive nanofiller, conductive oxides and mixtures thereof.

7. The composition of claim 1, wherein the epoxy is selected from the group of monofunctional and multifunctional glycidyl ethers of Bisphenol A and Bisphenol F, aliphatic and aromatic epoxies, saturated and unsaturated epoxies, cycloaliphatic epoxy resins, or mixtures thereof.

8. The composition of claim 3 wherein the conductivity additive is selected from of the group consisting of flow additives, adhesion promoters, and rheology modifiers.

9. The composition of claim 1, wherein the composition is B-stageable.

10. A semiconductor package comprising the composition of claim 1.

* * * * *